US011004748B2

(12) United States Patent
Gu et al.

(10) Patent No.: US 11,004,748 B2
(45) Date of Patent: May 11, 2021

(54) SEMICONDUCTOR DEVICES WITH WIDE GATE-TO-GATE SPACING

(71) Applicant: GLOBALFOUNDRIES U.S. INC., Santa Clara, CA (US)

(72) Inventors: Sipeng Gu, Clifton Park, NY (US); Jiehui Shu, Clifton Park, NY (US); Haiting Wang, Clifton Park, NY (US)

(73) Assignee: GLOBALFOUNDRIES U.S. Inc., Santa Clara, CA (US)

( * ) Notice: Subject to any disclaimer, the term of this patent is extended or adjusted under 35 U.S.C. 154(b) by 34 days.

(21) Appl. No.: 16/432,899

(22) Filed: Jun. 5, 2019

(65) Prior Publication Data
US 2020/0388540 A1 Dec. 10, 2020

(51) Int. Cl.
*H01L 21/8234* (2006.01)
*H01L 29/423* (2006.01)
*H01L 29/10* (2006.01)
*H01L 27/088* (2006.01)

(52) U.S. Cl.
CPC .... *H01L 21/823437* (2013.01); *H01L 27/088* (2013.01); *H01L 29/1079* (2013.01); *H01L 29/42372* (2013.01)

(58) Field of Classification Search
CPC ......... H01L 21/823437; H01L 21/8238; H01L 21/823431; H01L 21/823821; H01L 27/11807; H01L 27/0924; H01L 27/0886; H01L 29/42372; H01L 29/66545; H01L 29/41791; H01L 29/42392; H01L 29/78696; H01L 29/66795; H01L 27/088
See application file for complete search history.

(56) References Cited

U.S. PATENT DOCUMENTS

| 7,986,184 | B2 | 7/2011 | Besling et al. | |
| 8,846,466 | B2* | 9/2014 | Yuan | H01L 27/1211 438/197 |
| 8,860,148 | B2* | 10/2014 | Hu | H01L 27/0629 257/401 |
| 9,564,369 | B1* | 2/2017 | Kim | H01L 29/6656 |
| 10,205,020 | B2* | 2/2019 | Lee | H01L 29/7848 |
| 2014/0145263 | A1* | 5/2014 | Cheng | H01L 27/1211 257/347 |

(Continued)

OTHER PUBLICATIONS

J. Lacord et al., Fast evaluation of Continuous-RX impact on performance for Strained FDSOI, 2017, 361-364, The Japan Society of Applied Physics Tokyo, Japan.

*Primary Examiner* — Khiem D Nguyen
(74) *Attorney, Agent, or Firm* — David Cain

(57) ABSTRACT

This disclosure relates to a method of fabricating semiconductor devices with a gate-to-gate spacing that is wider than a minimum gate-to-gate spacing and the resulting semiconductor devices. The method includes forming gate structures over an active structure, the gate structures including a first gate structure, a second gate structure, and a third gate structure. The second gate structure is between the first and third gate structures. A plurality of epitaxial structures are formed adjacent to the gate structures, wherein the second gate structure separates two epitaxial structures and the two epitaxial structures are between the first and third gate structures. The second gate structure is removed. A conductive region is formed to connect the epitaxial structures between the first and third gate structures.

19 Claims, 12 Drawing Sheets

(56) References Cited

U.S. PATENT DOCUMENTS

| | | | | |
|---|---|---|---|---|
| 2016/0233094 A1* | 8/2016 | Anderson | ............. | H01L 23/528 |
| 2016/0372316 A1* | 12/2016 | Yang | ................... | H01L 27/1211 |
| 2017/0194452 A1* | 7/2017 | Alptekin | ........... | H01L 21/76834 |
| 2019/0363084 A1* | 11/2019 | Jo | ................... | H01L 21/823871 |

* cited by examiner

SEMICONDUCTOR DEVICES WITH WIDE GATE-TO-GATE SPACING

FIELD OF THE INVENTION

The disclosed subject matter relates generally to semiconductor devices, and more particularly to a method of fabricating semiconductor devices with a gate-to-gate spacing that is wider than a minimum gate-to-gate spacing and to the resulting semiconductor devices.

BACKGROUND

Semiconductor devices with a wider gate-to-gate spacing than a minimum gate-to-gate spacing are frequently used for high frequency applications. The gate-to-gate spacing may be two to three times wider than the minimum gate-to-gate spacing. A wide gate-to-gate spacing allows a wider gate to source/drain contact spacing, which results in a lower gate to source/drain capacitance. In addition, a wide gate-to-gate spacing also allows a larger source/drain contact area, resulting in a lower source/drain contact resistance. A lower device resistance and capacitance leads to a higher maximum operating frequency.

One of the challenges of fabricating semiconductor devices with a wide gate-to-gate spacing is fabricating substantially uniform epitaxial structures independent of the local pattern density. It is desirable to have substantially uniform epitaxial structures in devices with wide and narrow gate-to-gate spacing. Epitaxial structures fabrication includes etching to form cavities and filling the cavities by an epitaxial growth process. A semiconductor device with a wider gate-to-gate spacing will have an epitaxial under-fill issue due to having less silicon seeding area per unit volume in the formed cavities as compared with the cavities in a semiconductor device having a narrow gate-to-gate spacing.

It is also challenging to fabricate substantially uniform gates for devices with a wide gate-to-gate spacing, because a wide gate-to-gate spacing may result in various patterning issues during gate lithography and etching processes. For example, issues such as photoresist flopping and lifting may occur.

Hence, there is a need to present a method to overcome the challenges mentioned above.

SUMMARY

To achieve the foregoing and other aspects of the present disclosure, a method of fabricating semiconductor devices with a gate-to-gate spacing that is wider than a minimum gate-to-gate spacing and the resulting semiconductor devices are presented.

According to an embodiment of the disclosure, a method of forming a semiconductor device is provided, which includes forming gate structures over an active structure, the gate structures including a first gate structure, a second gate structure and a third gate structure. The second gate structure is between the first and third gate structures. A plurality of epitaxial structures are formed adjacent to the gate structures, wherein the second gate structure separates two epitaxial structures and the two epitaxial structures are between the first and third gate structures. The second gate structure is removed. A conductive region is formed to connect the epitaxial structures between the first and third gate structures.

According to another embodiment of the disclosure, a method of forming a semiconductor device is provided, which includes forming gate structures over an active structure. The gate structures including a first gate structure, a second gate structure and a third gate structure, wherein the second gate structure is between the first and third gate structures and the gate structures having side surfaces and a top surface. Spacer structures are formed on the side surfaces of the gate structures. Doped regions are formed under the spacer structures. A plurality of epitaxial structures are formed adjacent to the gate structures, wherein the second gate structure separates a first and a second epitaxial structures, and said first and said second epitaxial structures are between the first and third gate structures. The second gate structure is removed, and a conductive region is formed to connect the first and second epitaxial structures between the first and third gate structures.

According to yet another embodiment of the disclosure, a semiconductor device is provided, which includes an array having active structures, gate structures, and epitaxial structures. The array of active structures includes a first active structure and a second active structure. The gate structures include a first gate structure over the first and second active structures, a second gate structure over the first active structure, and a third gate structure over the first and second active structures. A first epitaxial structure formed between the first gate structure and the second gate structure, wherein the first epitaxial structure is formed in the first active structure. A second epitaxial structure formed between the second gate structure and the third gate structure, wherein the second epitaxial structure is formed in the first active structure. A third and fourth epitaxial structures formed between the first and third gate structures, wherein the third and fourth epitaxial structures are formed in the second active structure. A conductive region in the second active structure separating the third and fourth epitaxial structures between the first and third gate structures. A conductive layer is formed over the conductive region.

BRIEF DESCRIPTION OF THE DRAWINGS

The embodiments of the present disclosure will be better understood from a reading of the following detailed description, taken in conjunction with the accompanying drawings.

Figure 1A:
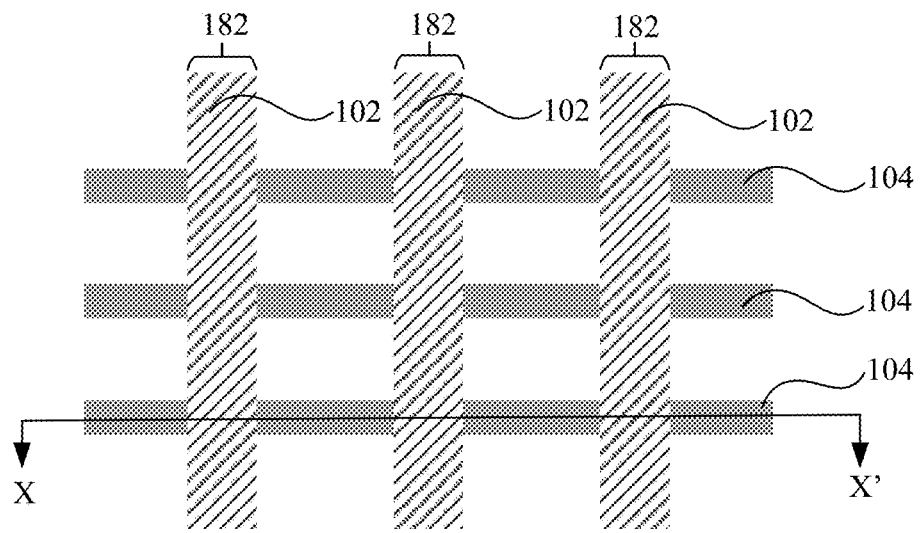
FIG. 1A is a top view and FIG. 1B is a cross-sectional view, taken along the section line X-X' of FIG. 1A, of a partially completed semiconductor device, according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the disclosure. Additionally, elements in the drawings are not necessarily drawn to scale. For example, the dimensions of some of the elements in the drawings may be exaggerated relative to other elements to help improve understanding of embodiments of the disclosure. The same reference numerals in different drawings denote the same elements, while similar reference numerals may, but do not necessarily, denote similar elements.

DETAILED DESCRIPTION

Various embodiments of the disclosure are described below. The embodiments disclosed herein are exemplary and not intended to be exhaustive or limiting to the disclosure.

The disclosure relates to a method of fabricating semiconductor devices with gate-to-gate spacings that are wider than a minimum gate-to-gate spacing and to the resulting semiconductor devices. The semiconductor devices may be transistor devices such as complementary metal-oxide-semiconductor (CMOS) devices. A CMOS device includes a P-type metal-oxide-semiconductor (PMOS) device and/or an N-type metal-oxide-semiconductor (NMOS) device.

In particular, while the disclosure discusses various embodiments of transistor devices, it should be noted that the disclosure is not limited to any particular type of semiconductor device. The method disclosed herein may be applied to any type of transistor devices, such as tri-gate field-effect-transistor (FET) devices, FinFET devices or planar-type metal-oxide-semiconductor-field-effect-transistor (MOSFET) devices.

The various embodiments of the transistor devices in this present disclosure may be fabricated with gate first or gate last transistor fabrication process techniques. In a gate first process, conductive layers over first structure areas (e.g. NMOS areas, etc.) and second structure areas (e.g. PMOS areas, etc.) are formed and patterned to form gate structures followed by conventional CMOS processing, including formation of source and drain regions, formation of spacers and deposition of inter-level dielectric (ILD) material. In a gate last process, dummy gate structures are formed, followed by conventional CMOS processing, including formation of the source and drain regions, formation of spacers and deposition of ILD material. Thereafter, the dummy gate structures are removed, followed by conventional formation of replacement gate structures.

Aspects of the disclosure are now described in detail with accompanying drawings. It is noted that like and corresponding elements are referred to by the use of the same reference numerals. However, it is noted that specific elements may be denoted by a reference numeral and a subscript, for example 104a, 104b, etc. When those elements are referred to generically, merely the reference numerals are used, for example 104, 204, etc.

FIG. 1A is a simplified top view of a partially completed semiconductor device according to an embodiment of the disclosure. The device includes an array of active structures 104 and gate structures 182. The gate structures 182 transverse the active structures 104. In an aspect of the present disclosure, the gate structures 182 are substantially uniform.

In an aspect of the present disclosure, the active structure 104 is a semiconductor fin. Those skilled in the art would recognize, after a complete reading of the disclosure, the number and placement locations of the active structures or fins 104 and the gate structures 182 may vary according to the specific design of each FinFET device.

Figure 1B:
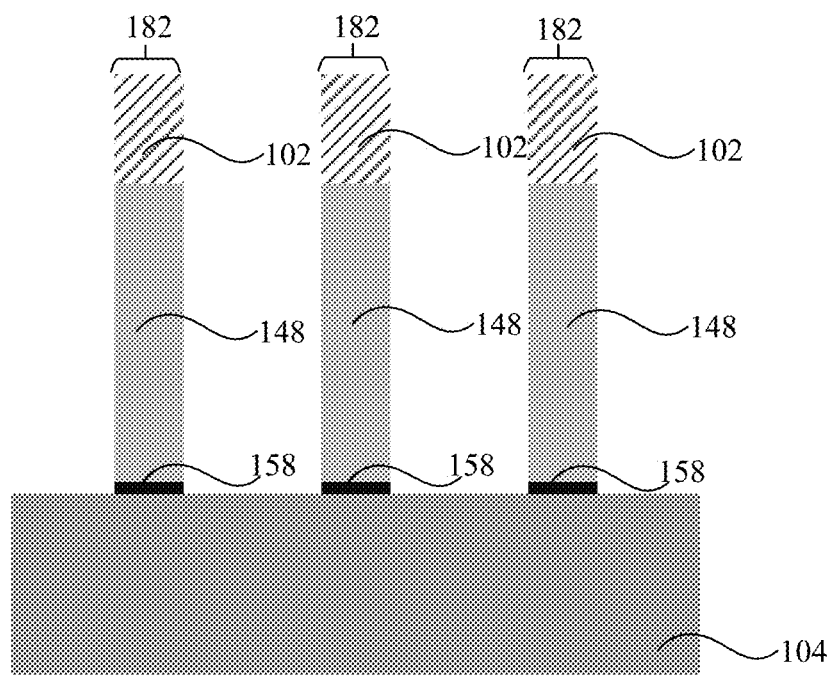

FIG. 1B is a corresponding cross-sectional view of the partially completed semiconductor device taken along the line X-X', as indicated in FIG. 1A. The gate structures 182 include a gate cap 102, a dummy gate 148 and a gate dielectric layer 158. The gate cap 102 may be made of silicon nitride. The dummy gate 148 may be made of a sacrificial material such as amorphous silicon. The gate dielectric layer 158 may be made of silicon dioxide. In an embodiment, the gate dielectric layer 158 is between 2 nm and 4 nm thick. The gate structures 182 include side surfaces and a top surface.

While the fins 104 define active structures for the semiconductor device in the present disclosure, it should be noted that the fin 104 is used only as a non-limiting example of an active structure. Other active structures (e.g., a doped layer on a top surface of a bulk semiconductor substrate or a semiconductor-on-insulator layer, etc.) may be used for different types of transistor devices.

The active structures 104 may include of any appropriate semiconductor material, such as silicon, silicon germanium, silicon carbon, other II-VI or III-V semiconductor compounds and the like. In an embodiment of the disclosure, the semiconductor material of the active structures 104 is preferably silicon.

Figure 2A:
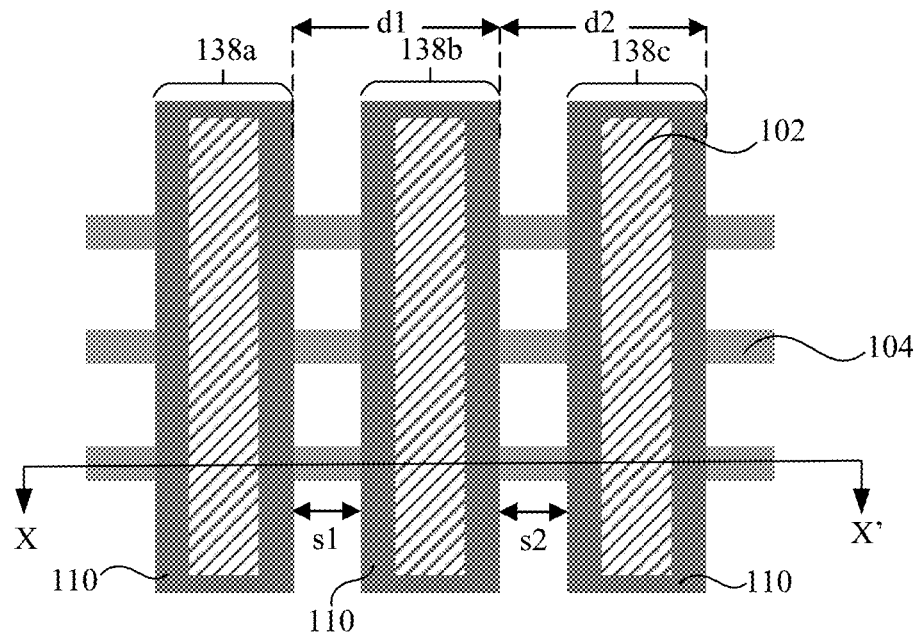
FIG. 2A is a top view and FIG. 2B is a cross-sectional view, taken along the section line X-X' of FIG. 2A, of a partially completed semiconductor device, according to an embodiment of the disclosure.

FIG. 2A is a simplified top view of a partially completed semiconductor device according to an embodiment of the disclosure after formation of spacer structures 110 on side surfaces of three gate structures 138a, 138b and 138c. The spacer structures 110 may be formed of a low dielectric constant material, such as silicon nitride. The silicon nitride layer for the spacer structures 110 may be deposited by chemical vapor deposition (CVD.)

The first gate structure 138a and the second gate structure 138b are separated by a pitch d1. The second gate structure 138b and a third gate structure 138c are separated by a pitch d2. The pitch d1 and the pitch d2 may or may not be equal.

In this embodiment, the pitch d1 has a width that is equal to the CPP of the semiconductor device, with a corresponding minimum gate-to-gate spacing S1. In another embodiment of the disclosure, the pitch d2 may be equal to or wider than the pitch d1, with a corresponding gate-to-gate spacing S2.

The term "pitch" as used herein defines a distance from a left edge of a structure to a left edge of an adjacent identical structure. The minimum pitch of gate structures in a semiconductor device is termed "contacted poly pitch" (CPP), with a corresponding minimum gate-to-gate spacing. The term "spacing" as used herein defines a distance between two adjacent structures.

Figure 2B:
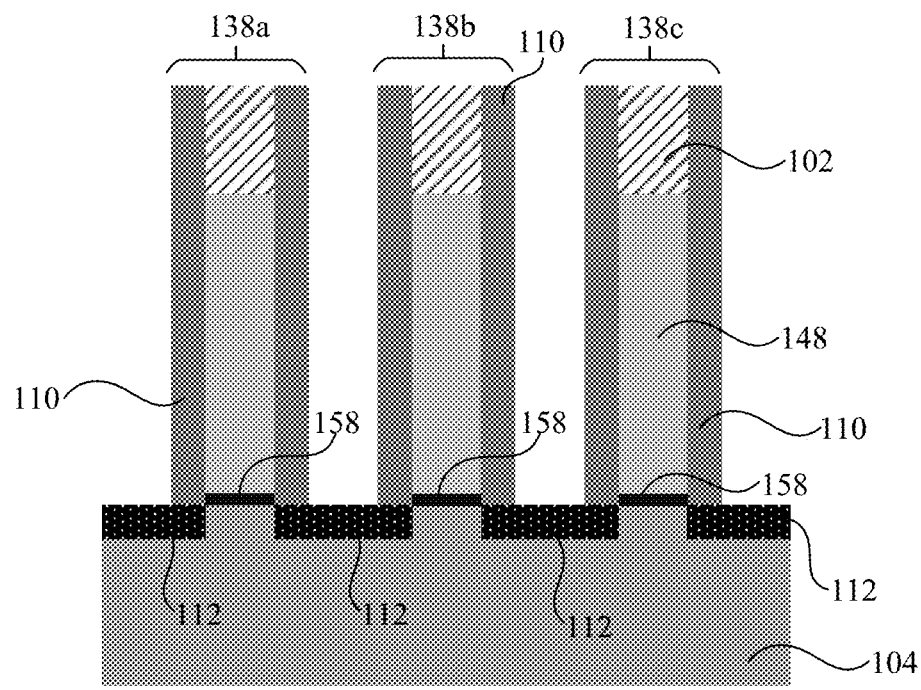

FIG. 2B is a corresponding cross-sectional view of the partially completed semiconductor device taken along the section line X-X' shown in FIG. 2A. A plurality of doped regions 112 are formed in the active structure 104 adjacent to the sides of the gate structures 138a, 138b and 138c and under the spacer structures 110. In one embodiment, the doped region 112 is a lightly doped drain (LDD). The doped region 112 may be formed by implanting arsenic followed by an activation anneal.

Figure 3A:
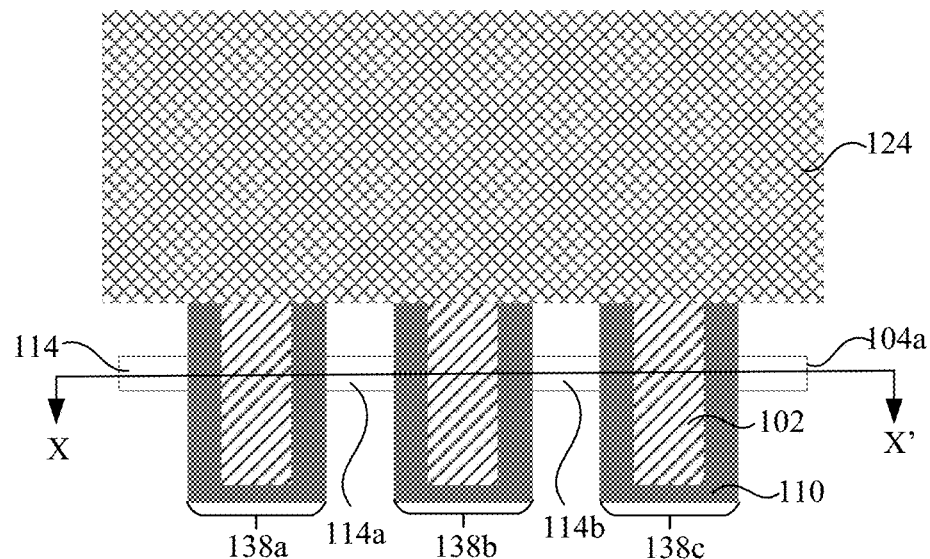
FIG. 3A is a top view and FIG. 3B is a cross-sectional view, taken along the section line X-X' of FIG. 3A, of a partially completed semiconductor device, according to an embodiment of the disclosure.

Referring to FIG. 3A, cavities 114 are formed in the active structure 104a adjacent to the gate structures 138a, 138b and 138c. A mask layer 124 may protect other active regions 104 from further processing during the formation of the cavities 114. The mask layer 124 may be made of an oxide hard mask.

Using the first, second and third gate structures 138a, 138b and 138c, respectively, as masking features, the cavities 114 are formed by a suitable material removing process. The cavity formation is performed by known techniques in the art, such as a reactive ion etching (ME) process. The formed cavities 114 are substantially uniform in size and have a width substantially equal to the minimum gate-to-gate spacing of the semiconductor device. For example, the two cavities 114a and 114b are separated by second gate structure 138b and are between the first and third gate structures 138a and 138c.

Figure 3B:
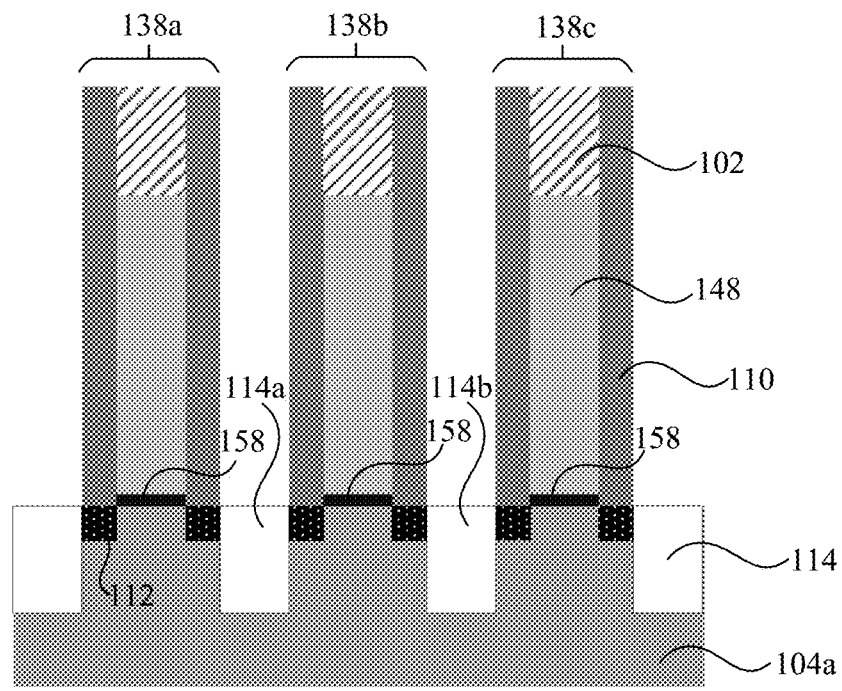

FIG. 3B is a corresponding cross-sectional view of the partially completed semiconductor device taken along the section line X-X' shown in FIG. 3A. The LDD regions 112 are shown under the spacer structures 110 and abutting the cavities 114.

Figure 4A:
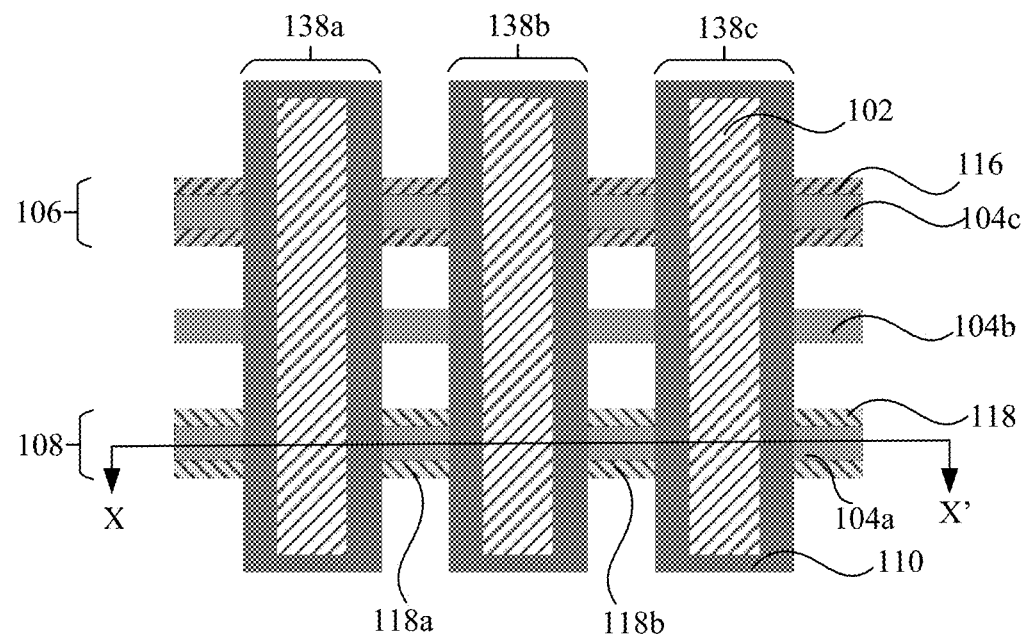
FIG. 4A is a top view and FIG. 4B is a cross-sectional view, taken along the section line X-X' of FIG. 4A, of a partially completed semiconductor device, according to an embodiment of the disclosure.

Referring to FIG. 4A, epitaxial structures 118 are formed in the cavities 114 adjacent to the gate structures 138a, 138b and 138c. The epitaxial structures 118 are formed over the active structure 104a, which is represented as a dashed outline in FIG. 4A.

The epitaxial structures 118 may be formed by growing an epitaxial material using a suitable epitaxy process, such as vapor-phase epitaxy process, liquid-phase epitaxy process or solid-phase epitaxy process. The epitaxial structures 118 may be grown selectively, i.e., the epitaxial growth only occurs over certain surfaces, such as over semiconductor surfaces in the cavities 114, while other surfaces remain substantially free of epitaxial material. The epitaxial growth occurs both horizontally and laterally, resulting in the epitaxial structures 118 being taller and wider than the cavities 104.

Since the cavities 114 are substantially uniform in size, a similar amount of epitaxial material is grown in each of the cavities 114 and the formed epitaxial structures 118 will have similar geometric properties. In an aspect of the present disclosure, the epitaxial structures are made of silicon phosphorus to form an NMOS FinFET device 108. Other materials may be used to grow the epitaxial structures 118, including silicon, silicon phosphorous carbide, germanium, gallium arsenide, gallium nitride, aluminum gallium indium phosphide, and/or other suitable combinations The epitaxial structures 118 may be in-situ doped or undoped. In an embodiment of the disclosure, the epitaxial structures 118 may be doped with N-type donors during the epitaxy process to form NMOS source/drain regions. The N-type donors may include phosphorus, arsenic, antimony, and/or other suitable dopants. One or more annealing processes may be performed to activate the source/drain regions. The annealing processes may include rapid thermal annealing (RTA) and/or laser annealing processes.

Additional process steps may be performed before, during or after forming the epitaxial structures 118. For example, when forming epitaxial structures 118 in the NMOS FinFET device 108, one or more layers, such as patterning layers and dielectric layers may be formed on PMOS devices 106 and dummy fin 104b as protection layers by suitable deposition processes.

As shown in FIG. 4A, the epitaxial structures 116 are grown in the active region 104c adjacent to the gate regions 138. The epitaxial structures 116 are grown prior to the formation of the epitaxial structures 118, and are covered by the mask layer 124. Hence, a gate region 138 also separates two epitaxial structures 116. In an embodiment of the present disclosure, the epitaxial structures 116 are made of silicon germanium to form PMOS FinFET devices 106. Although not shown, cavities are formed in the active region 104c adjacent to the gate regions 138 prior to forming the epitaxial structures 116. The epitaxial structures 116 are grown in the cavities. The epitaxial structures 116 are formed over the active structure 104c, shown as a dashed outline in FIG. 4A.

In an embodiment of the disclosure, the epitaxial structures 116 may be doped with P-type acceptors during the epitaxy process to form PMOS source/drain regions. The P-type acceptors may include boron, aluminum, gallium, indium, and/or other suitable dopants. The source/drain regions may be annealed to activate the dopants.

Figure 4B:
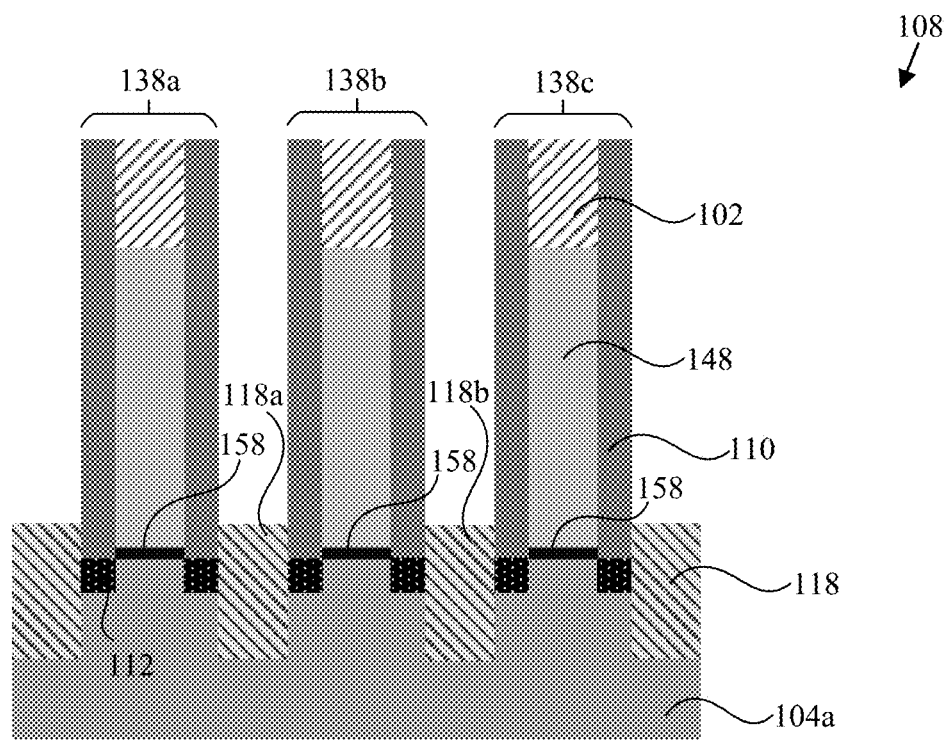

FIG. 4B is a corresponding cross-sectional view of the partially completed semiconductor device along the section line X-X' shown in FIG. 4A. The epitaxial structures 118 have a width substantially similar to the minimum gate-to-gate spacing of the NMOS FinFET device 108, as described in reference to FIG. 2A. In addition, the epitaxial structures 118 have upper surfaces that are coplanar.

Figure 5A:
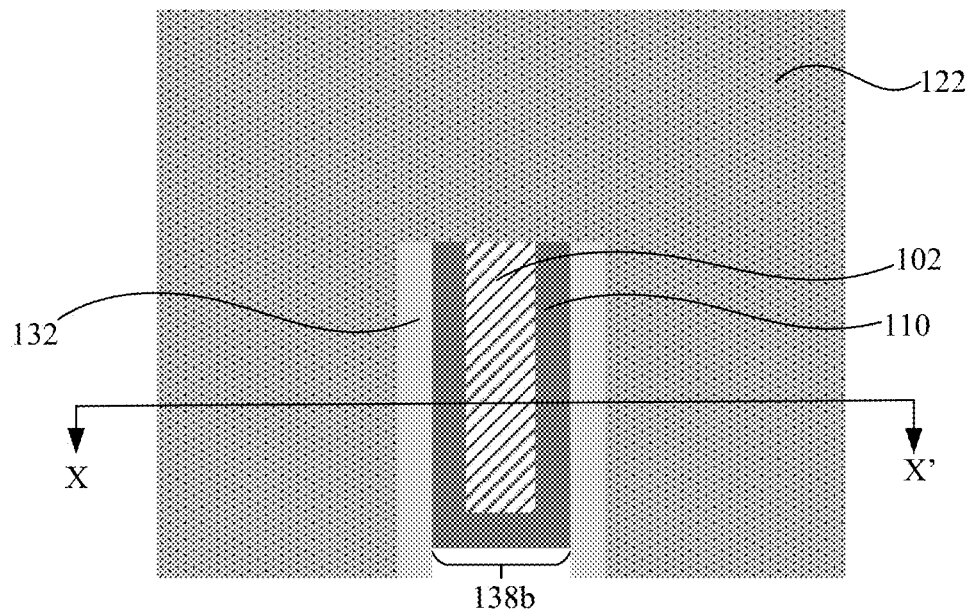
FIG. 5A is a top view and FIG. 5B is a cross-sectional view, taken along the section line X-X' of FIG. 5A, of a partially completed semiconductor device, according to an embodiment of the disclosure.

Referring to FIG. 5A, a hard mask layer 132 and a photoresist layer 122 are deposited over the semiconductor device. The photoresist layer 122 and the hard mask layer 132 are patterned to expose a section of the second gate structure 138b of the NMOS FinFET device 108.

In an aspect of the present disclosure, the hard mask layer 132 may be a spin on hard mask (SOH) made of spin on carbon material. The spin-on carbon material may include a polymeric compound containing atoms selected from the group consisting of carbon, hydrogen, oxygen, and nitrogen.

Figure 5B:
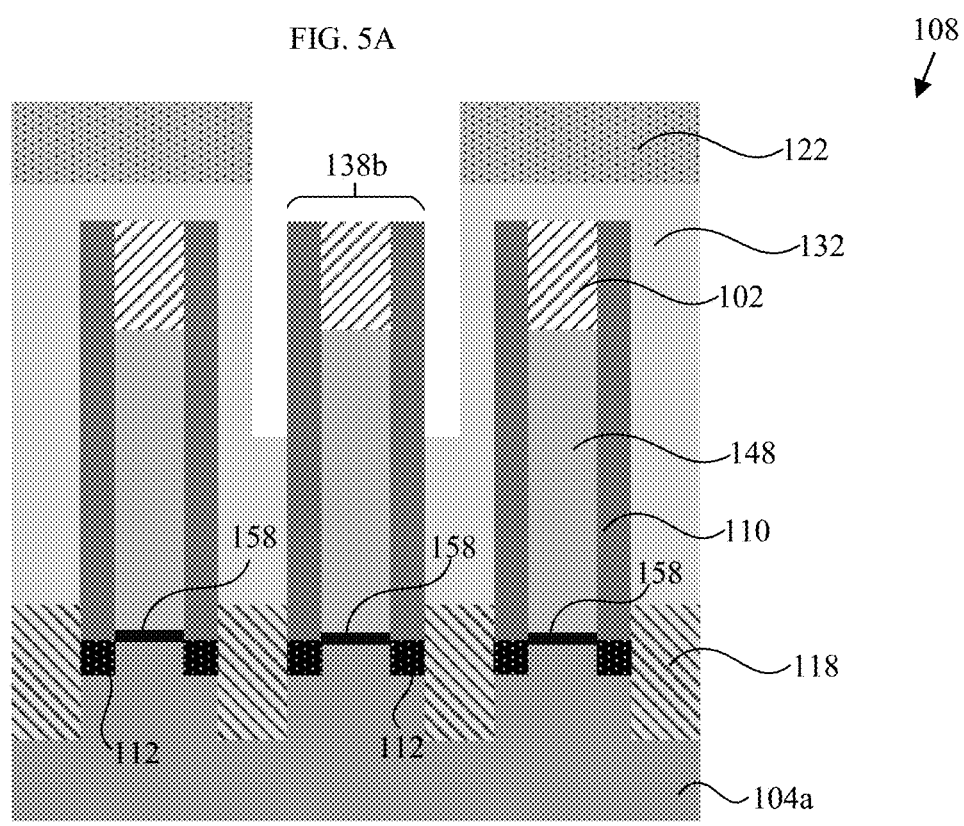

Referring to FIG. 5B, the hard mask layer 132 is patterned to expose an upper portion of the second gate structure 138b. The patterning of the hard mask layer may be performed by a timed etching process, such as a dry etching process.

Figure 6A:
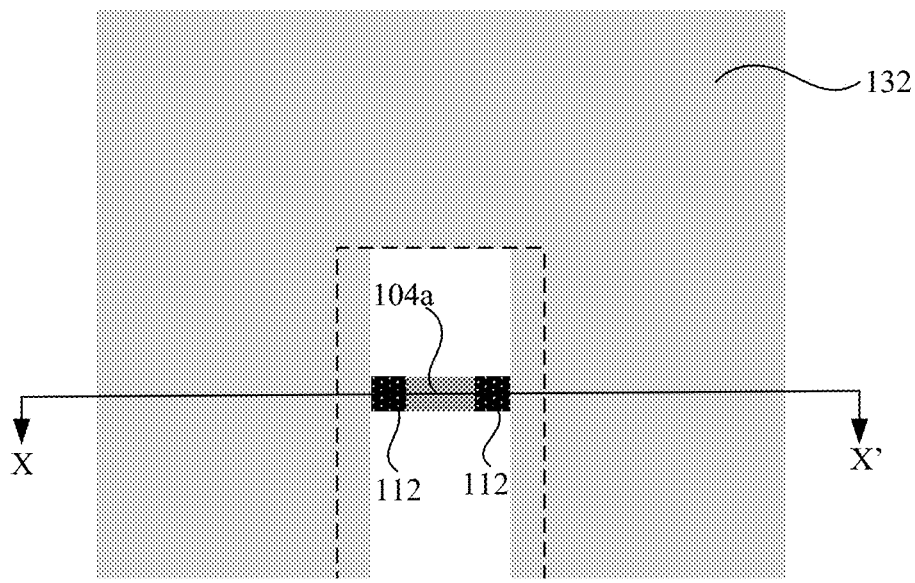
FIG. 6A is a top view and FIG. 6B is a cross-sectional view, taken along the section line X-X' of FIG. 6A, of a partially completed semiconductor device, according to an embodiment of the disclosure.

Referring to FIG. 6A, the second gate structure 138b over the NMOS FinFET device 108 is removed. The dashed lines represent an opening in the hard mask layer 132. In an aspect of the present disclosure, the second gate structure 138b is removed by selective etching. The gate removal process includes removing the silicon nitride gate cap 102 and the amorphous silicon dummy gate 148. The dummy gate removal may be by a combination of wet and dry etch process. The silicon nitride dielectric spacer structures 110 are also removed. The gate removal process stops at the gate dielectric layer 158. The gate dielectric layer 158 serves as an etch stop layer and provides the selectivity for the gate removal process. The gate dielectric layer 158 may subsequently be removed by a wet etch process.

In an aspect of the present disclosure, the term "selective etching" means a chemical etch technique that can selectively eliminate the targeted layer without etching the layer beneath the targeted layer (i.e., the "stop" layer). This is achieved by adjusting the composition of the etchant to control the relative etching rates between the targeted layer and the "stop" layer.

The removal of the second gate structure 138b exposes a portion of the active structure 104a having a width substantially equal to a gate length of the second gate structure 138b. Although not shown, the dummy fin 104b is also exposed after the gate removal process, as the foregoing mask patterning steps will also expose the portion of the second gate structure 138b over the dummy fin.

Figure 6B:
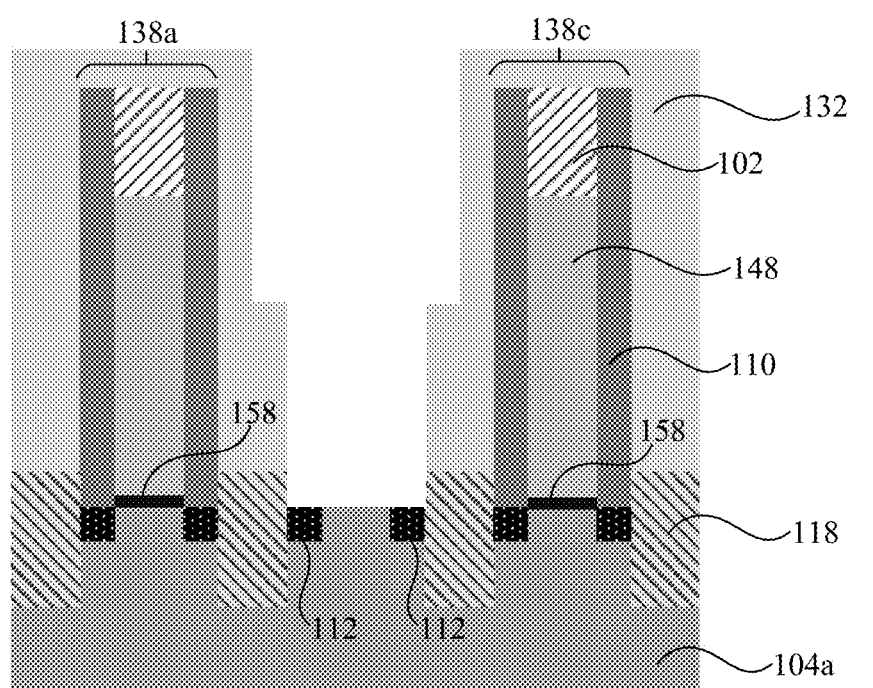

Referring to FIG. 6B, the removal of the second gate structure 138b exposes a portion of an active structure 104a having an upper surface that is coplanar with an upper surface of a portion of the active structure 104a underneath the first and third gate structures, 138a and 138c, respectively.

As also shown in FIG. 6B, an upper portion of the opening in the hard mask layer 132 is larger than a lower portion thereof after the removal of the second gate structure 138b. The lower portion of the opening in the hard mask layer 132 is equal to the gate length between the epitaxial regions 118a and 118b, which is defined by the removed second gate structure 138b.

Figure 7A:
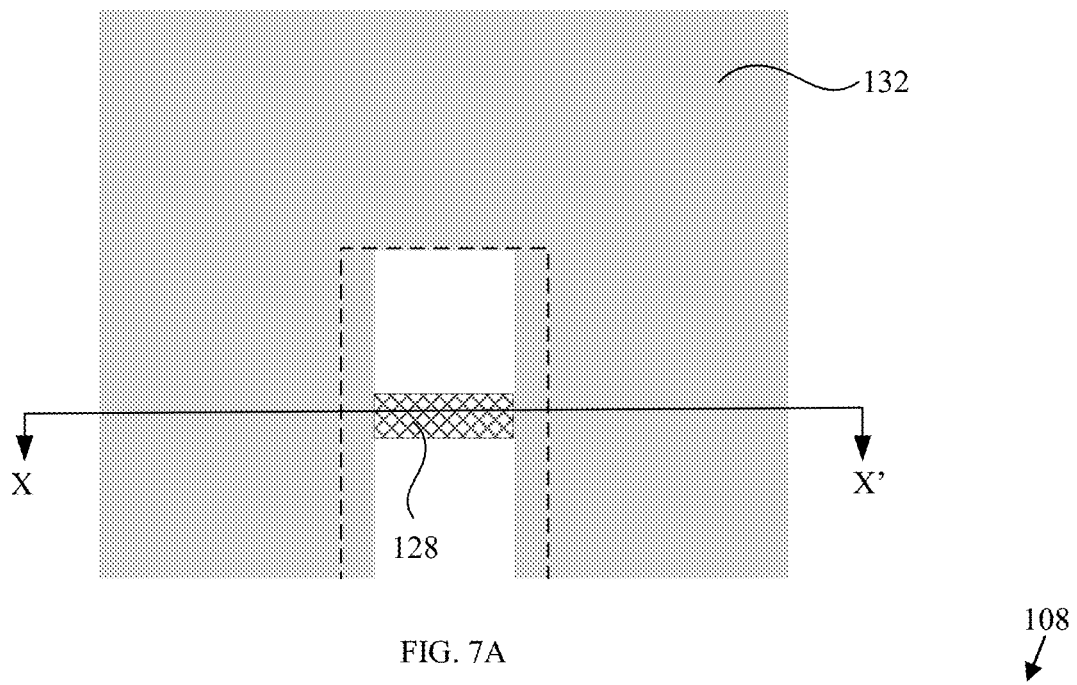
FIG. 7A is a top view and FIG. 7B is a cross-sectional view, taken along the section line X-X' of FIG. 7A, of a partially completed semiconductor device, according to an embodiment of the disclosure.
Figure 7B:
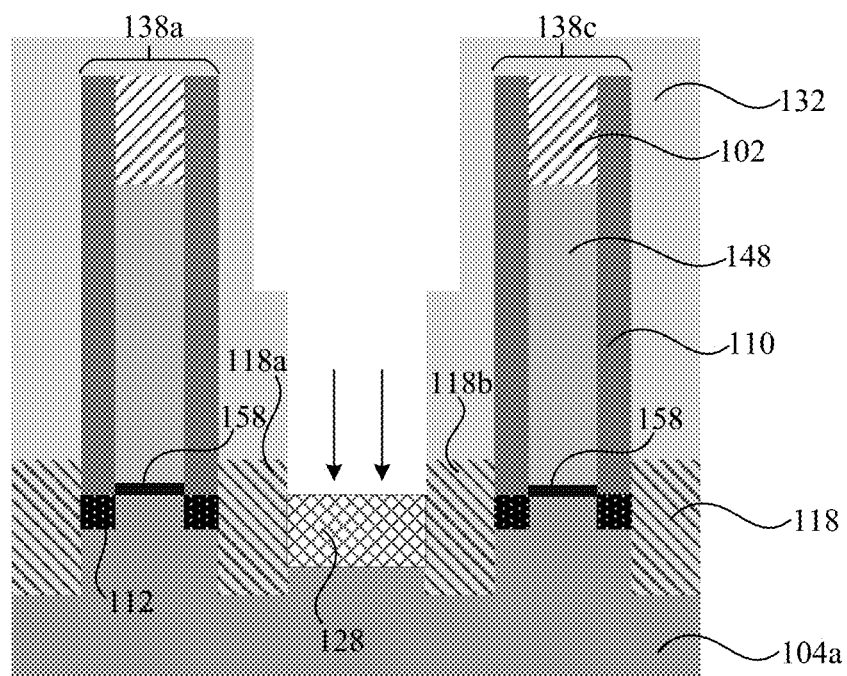

FIG. 7A is a top-view of a partially completed semiconductor device according to an embodiment of the disclosure, and FIG. 7B is the corresponding cross-sectional view taken along the section line X-X'. According to the present disclosure, a conductive region 128 is formed between the epitaxial structures 118a and 118b. In a preferred embodiment, the exposed portion of the active structure 104a is implanted with dopants to form a conductive region 128 connecting the epitaxial structures 118a and 118b, between the first and third gate structures, 138a and 138c, respectively. The doped regions 112 become incorporated into the conductive region 128. In an aspect of the present disclosure, the doping species may be phosphorus or arsenic with a dose in the range from about $1.0 \times 10^{15}$ cm$^{-2}$ to about $1.0 \times 10^{16}$ cm$^{-2}$. It is also within the scope of the present disclosure to form a conductive region 128 between the epitaxial structures 118a and 118b by forming an epitaxial layer over the exposed portion of active structure 104a, wherein the epitaxial layer may have a different thickness as compared to the epitaxial structures 118a and 118b.

Figure 8A:
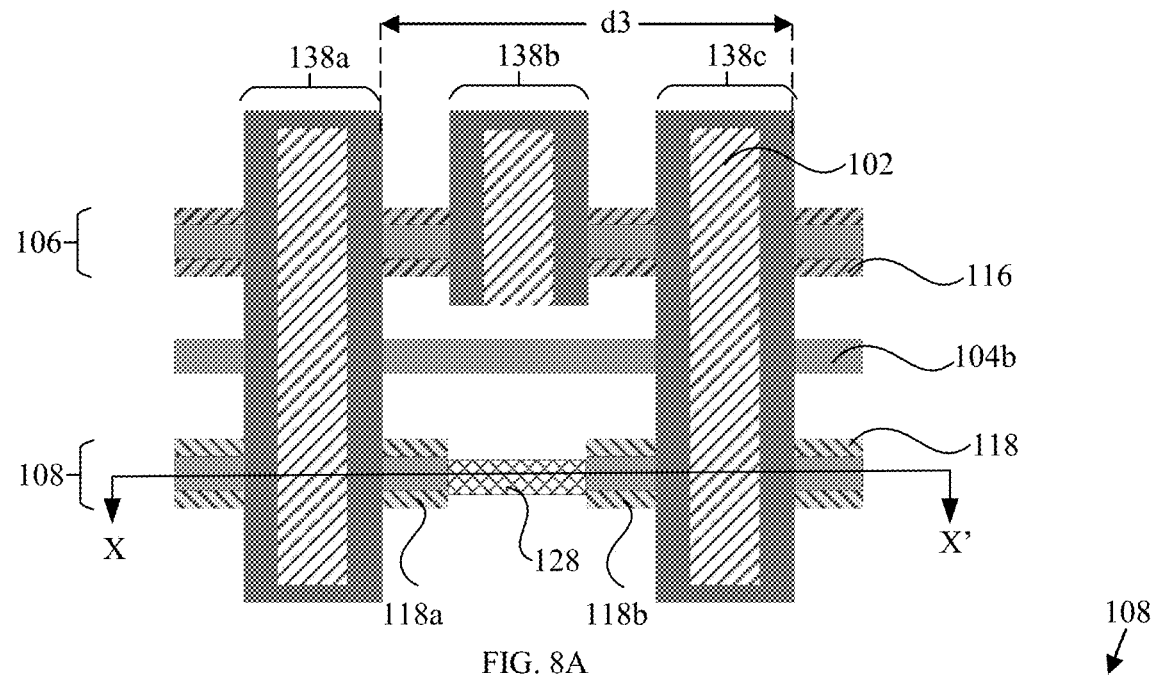
FIG. 8A is a top view and FIG. 8B is a cross-sectional view, taken along the section line X-X' of FIG. 8A, of a partially completed semiconductor device, according to an embodiment of the disclosure.
Figure 8B:
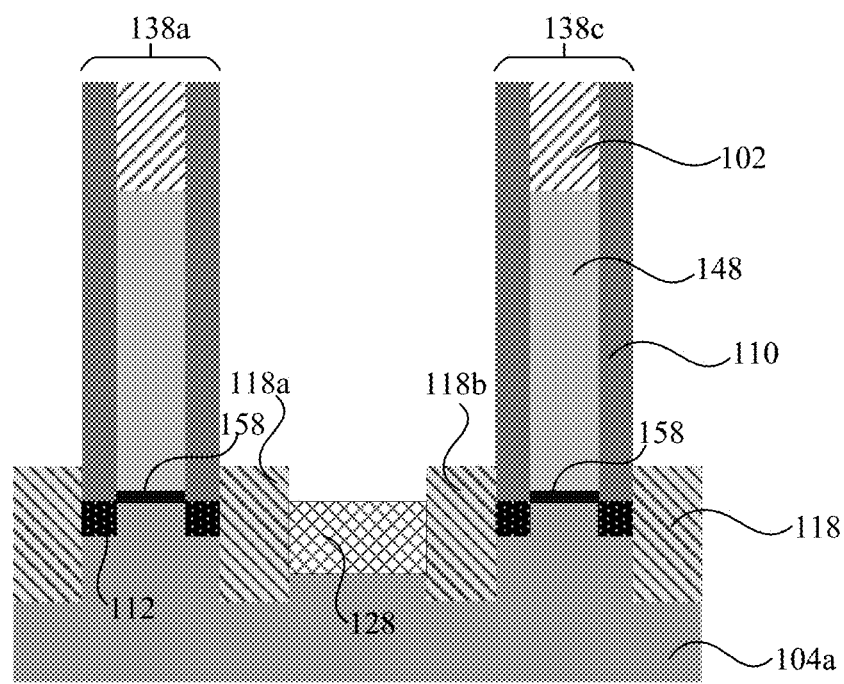

FIG. 8A is a top-view of a partially completed semiconductor device according to an embodiment of the disclosure while FIG. 8B is the corresponding cross-sectional view taken along section line X-X'. Referring to FIGS. 8A and 8B, the hard mask layer 132 is shown as removed, which can be performed by any appropriate process, such as a dry etching process. An annealing process may be performed to activate the implanted dopants in the conductive region 128. Hence, the conductive region 128 forms an electrical connection between the epitaxial structures 118a and 118b. The pitch d3 has a width that is equal to two times CPP.

Figure 9:
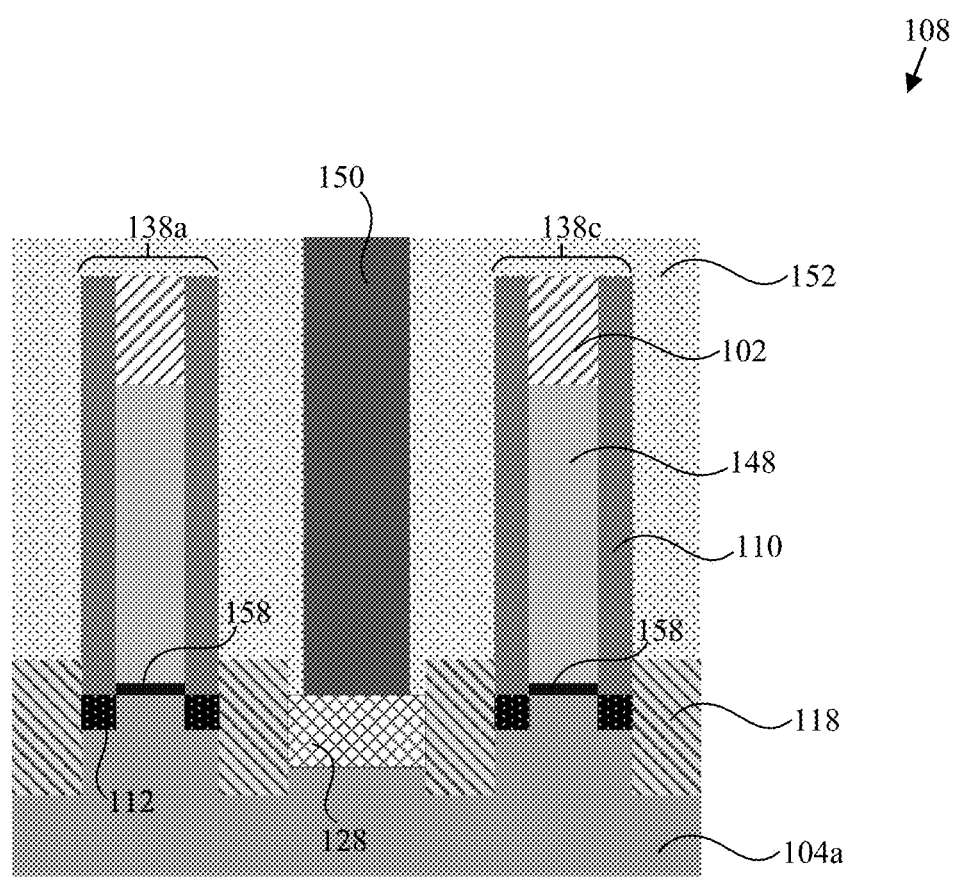
FIG. 9 is cross-sectional view of a semiconductor device, according to an embodiment of the disclosure.

FIG. 9 is a cross-sectional view of a semiconductor device, according to an embodiment of the disclosure. Referring to FIG. 9, a dielectric layer 152 is deposited over the NMOS FinFET device 108. The dielectric layer 152 is patterned to expose the conductive region 128. A conductive material is deposited over the conductive region 128 to form an electrical contact 150.

In an aspect of the present disclosure, the dielectric layer 152 is an interlayer dielectric (ILD). In some embodiments, the ILD may be made of a low dielectric constant material such as silicon oxide, silicon oxynitride, borosilicate glass (BSG), phosphoric silicate glass (PSG), fluorinated silicate glass (FSG), low dielectric constant (low-k) material, another suitable material or a combination thereof. In an aspect of the present disclosure, the electrical contact 150 may be made of tungsten or cobalt.

Figure 10A:
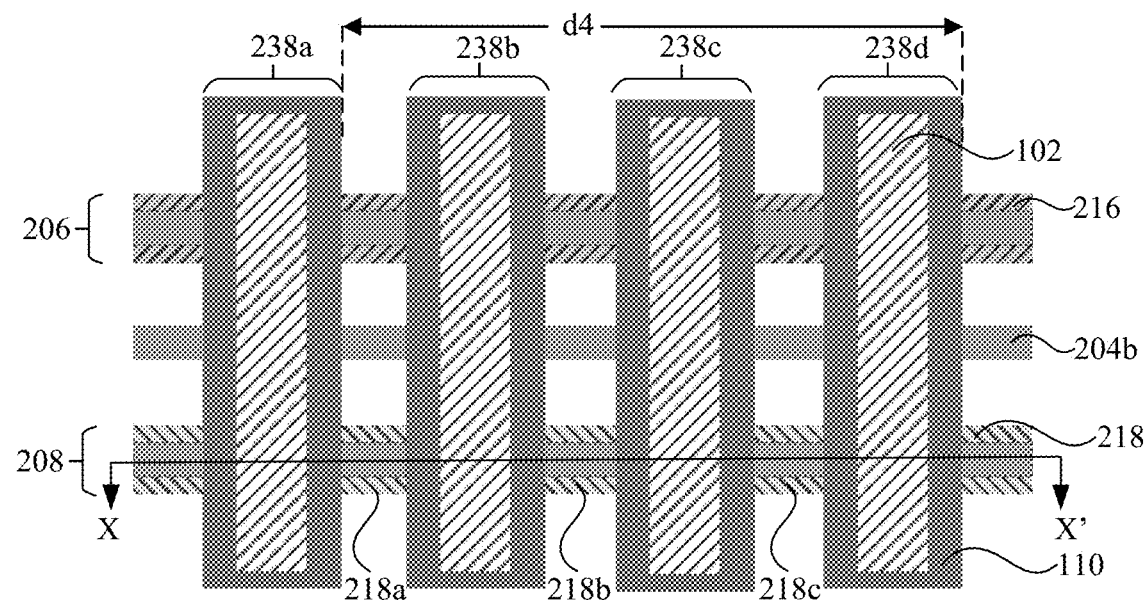
FIG. 10A is a top view and FIG. 10B is a cross-sectional view, taken along the section line X-X' of FIG. 10A, of a partially completed semiconductor device, according to an embodiment of the disclosure.
Figure 10B:
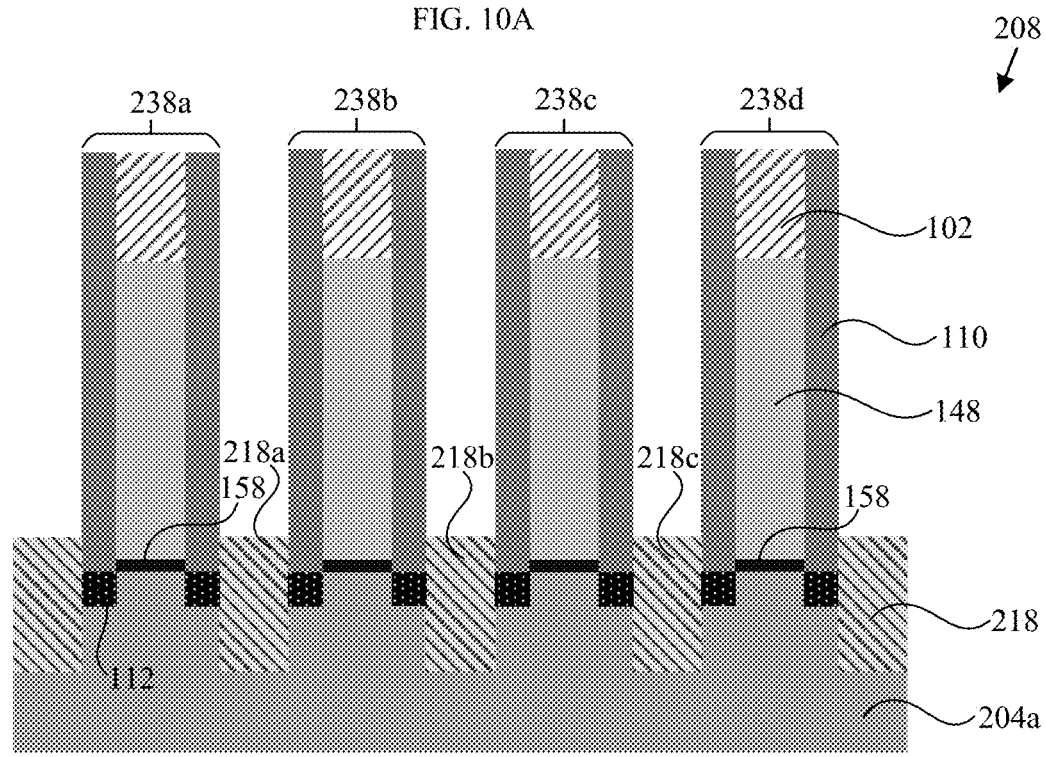

The present method, as described above with regard to FIGS. 1 through 9, may be used to create alternative device structures within the scope of this disclosure. For example, FIG. 10A is a top-view of a partially completed semiconductor device 208 according to another embodiment of the disclosure, and FIG. 10B is the corresponding cross-sectional view taken along the section line X-X'. Referring to FIGS. 10A and 10B, the gate structures may include a first gate structure 238a, a second gate structure 238b, a third gate structure 238c and a fourth gate structure 238d. The second gate structure 238b separates a first and second epitaxial structures, 218a and 218b, respectively, and the third gate structure 238c separates the second and third epitaxial structures, 218b and 218c, respectively. In this embodiment, the pitch d4 has a width that is equal to three times CPP.

Figure 11A:
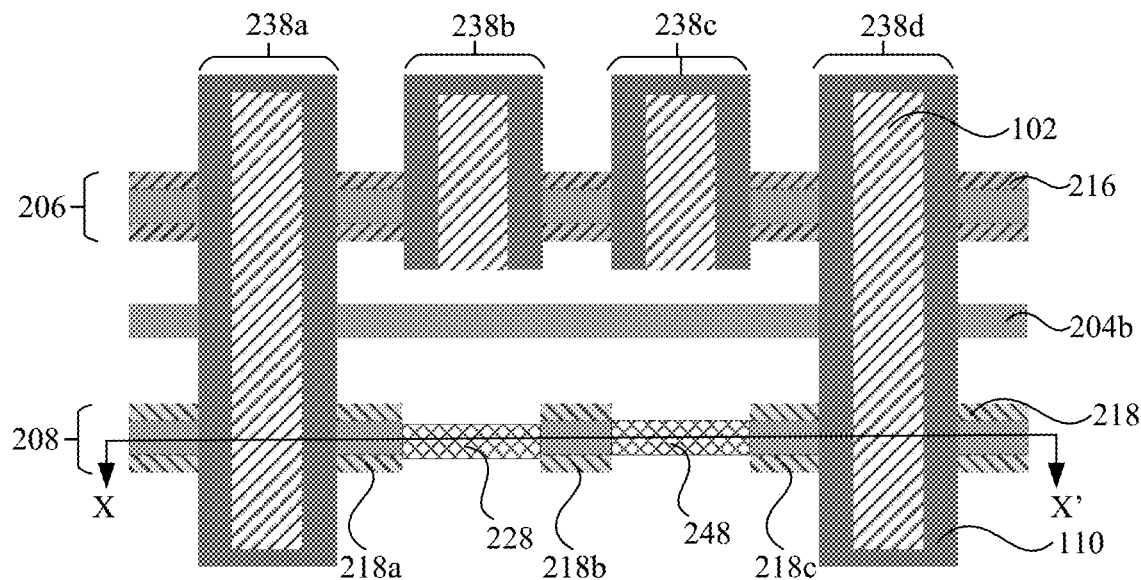
FIG. 11A is a top view and FIG. 11B is a cross-sectional view, taken along the section line X-X' of FIG. 11A, of a partially completed semiconductor device, according to an embodiment of the disclosure.
Figure 11B:
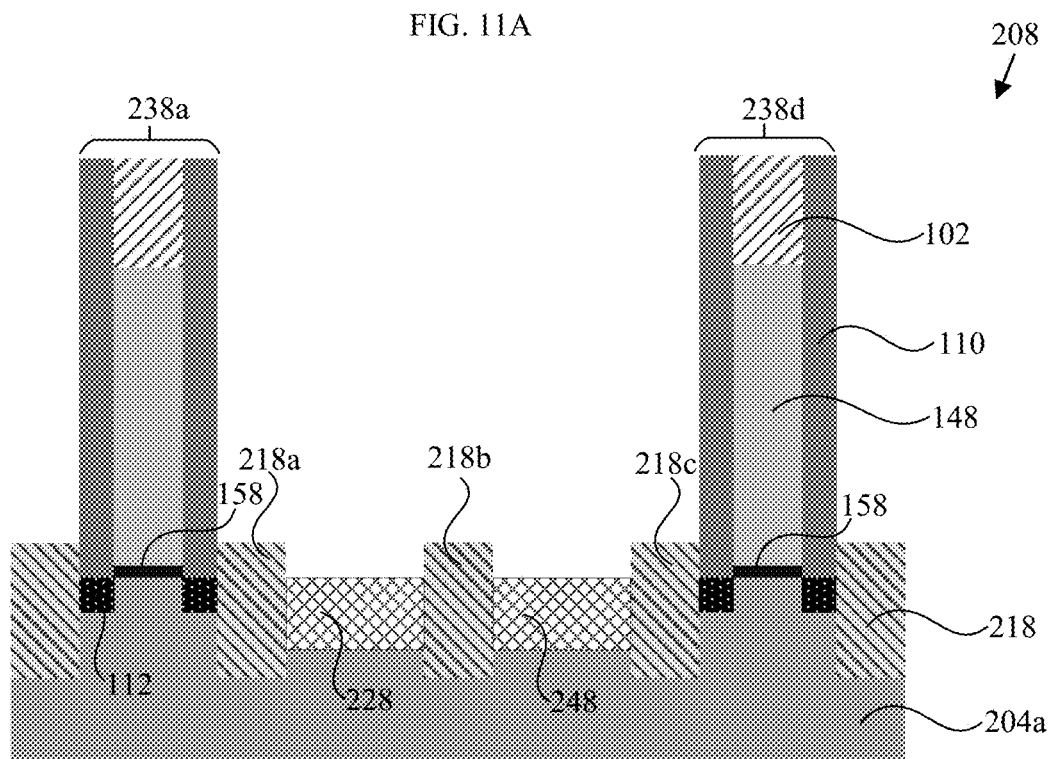

Referring to FIGS. 11A, a top-view, and 11B, a cross-sectional view, they show a portion of the second and third gate structures, 238b and 238c, respectively, over the NMOS FinFET device 208 removed to form a first and a second conductive regions, 228 and 248, respectively. The first conductive region 228 connects the first and second epitaxial structures, 218a and 218b, respectively, while the second conductive region 248 connects the second and third epitaxial structures, 218b and 218c, respectively.

Figure 12:
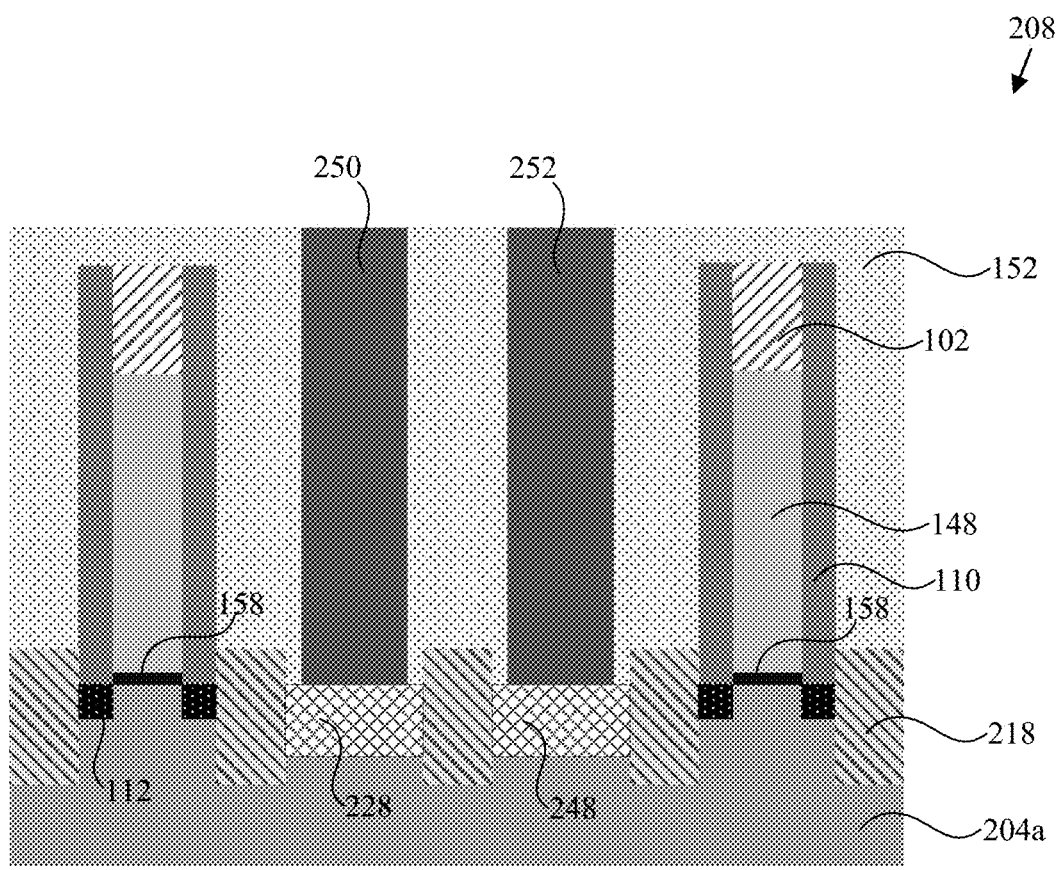
FIG. 12 is cross-sectional view of a semiconductor device, according to an embodiment of the disclosure.

Referring to FIG. 12, which shows the completed cross-sectional view of this embodiment, a dielectric layer 152 is deposited over the NMOS FinFET device 208. The dielectric layer 152 is patterned to expose the first and second conductive regions, 228 and 248, respectively. A conductive material is deposited over the conductive regions 228 and 248 to form electrical contacts 250 and 252, respectively.

It should be understood that a wider pitch d that is equal to four times CPP or more is within the scope of the present disclosure and would require the removal of additional dummy gates using process steps that are nearly identical to those described herein above.

The terms "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in one embodiment" herein do not necessarily all refer to the same embodiment.

In addition, unless otherwise indicated, all numbers expressing quantities, ratios, and numerical properties of materials, reaction conditions, and so forth used in the specification and claims are to be understood as being modified in all instances by the term "about".

While several exemplary embodiments have been presented in the above detailed description of the device, it should be appreciated that a number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed is:

1. A semiconductor device comprising:
   an array having active structures, gate structures, and epitaxial structures, the array of active structures including a first active structure and a second active structure;
   the gate structures including a first gate structure over the first and second active structures, a second gate structure over the first active structure, and a third gate structure over the first and second active structures;
   a first epitaxial structure formed between the first gate structure and the second gate structure, wherein the first epitaxial structure is formed in the first active structure;
   a second epitaxial structure formed between the second gate structure and the third gate structure, wherein the second epitaxial structure is formed in the first active structure;
   a third and fourth epitaxial structures formed between the first and third gate structures, wherein the third and fourth epitaxial structures are formed in the second active structure;
   a conductive region in the second active structure separating the third and fourth epitaxial structures between the first and third gate structures; and
   a conductive layer over the conductive region.

2. The semiconductor device of claim 1, wherein the third and fourth epitaxial structures formed in the second active structure are made of silicon phosphorus.

3. The semiconductor device of claim 1, wherein the first and second epitaxial structures formed in the first active structure are made of silicon germanium.

4. The semiconductor device of claim 1, wherein the conductive region contains dopants.

5. The semiconductor device of claim 1, wherein the third and fourth epitaxial structures have upper surfaces and the upper surfaces are coplanar.

6. The semiconductor device of claim 1, wherein the conductive region has a width substantially equal to a gate length of the second gate structure and an upper surface that is substantially coplanar with an active region underneath the first and third gate structures.

7. A method of forming a semiconductor device comprising:
   providing an array having active structures, gate structures, and epitaxial structures, the array of active structures including a first active structure and a second active structure;
   providing the gate structures including providing a first gate structure over the first and second active structures, providing a second gate structure over the first active structure, and providing a third gate structure over the first and second active structures;
   providing a first epitaxial structures between the first gate structure and the second gate structure, wherein the first epitaxial structure is formed in the first active structure;
   providing a second epitaxial structure between the second gate structure and the third gate structure, wherein the second epitaxial structure is formed in the first active structure;
   providing a third and fourth epitaxial structures between the first and third gate structures, wherein the third and fourth epitaxial structures are formed in the second active structure;
   providing a conductive region in the second active structure separating the third and fourth epitaxial structures between the first and third gate structures; and
   providing a conductive layer over the conductive region.

8. The method of claim 7, wherein providing the conductive region further comprises:
   doping a portion of the second active structure between the third and fourth epitaxial structures to electrically connect the third and fourth epitaxial structures.

9. The method of claim 7, wherein providing the second gate structure over the first active structure further comprises:
   providing the second gate structure over the first and second active structures;
   removing a first portion of the second gate structure from the second active structure leaving behind a second portion of the second gate structure over the first active structure.

10. The method of claim 8, further comprising:
    depositing a dielectric layer over the third and fourth epitaxial structures between the first and third gate structures;
    patterning the dielectric layer to expose the conductive region; and
    depositing the conductive layer over the conductive region to form an electrical contact.

11. The method of claim 7, wherein the formation of the third and fourth epitaxial structures further comprises forming cavities in the second active structure using the gate structures as masks.

12. The method of claim 11, wherein the formation of the third and fourth epitaxial structures further comprises growing silicon phosphorus epitaxial structures.

13. The method of claim 11, wherein the formation of the third and fourth epitaxial structures further comprises forming the cavities in the second active structure that have a width substantially equal to a minimum gate-to-gate spacing of the semiconductor device.

14. The method of claim 9, wherein the removal of the second gate structure exposes a portion of the second active structure having a width substantially equal to a gate length of the second gate structure and doping the exposed portion of the second active structure.

15. The method of claim 9, wherein the removal of the second gate structure exposes a portion of the second active structure having an upper surface that is coplanar with an upper surface of the second active structure underneath the first and third gate structures and doping the exposed portion of the second active structure.

16. A semiconductor device comprising:
- an array having active structures, gate structures, and epitaxial structures, the array of active structures including a first active structure and a second active structure;
- the gate structures including a first gate structure over the first and second active structures, a second gate structure over the first active structure, and a third gate structure over the first and second active structures;
- a first epitaxial structure formed between the first gate structure and the second gate structure;
- a second epitaxial structure formed between the second gate structure and the third gate structure;
- a third and fourth epitaxial structures formed between the first and third gate structures, wherein the third and fourth epitaxial structures are formed in the second active structure; and
- a conductive region in the second active structure separating the third and fourth epitaxial structures between the first and third gate structures, wherein the conductive region has a width substantially equal to a gate length of the second gate structure and an upper surface that is substantially coplanar with an active region underneath the first and third gate structures.

17. The semiconductor device of claim 16, wherein the first epitaxial structure and the second epitaxial structure are formed in the first active structure.

18. The semiconductor device of claim 16, wherein the conductive region contains dopants.

19. The semiconductor device of claim 16 further comprising:
- a conductive layer over the conductive region.

* * * * *